(12) United States Patent
Okushima

(10) Patent No.: US 8,558,314 B2
(45) Date of Patent: Oct. 15, 2013

(54) SEMICONDUCTOR DEVICE

(75) Inventor: Mototsugu Okushima, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 13/610,426

(22) Filed: Sep. 11, 2012

(65) Prior Publication Data

US 2013/0001697 A1    Jan. 3, 2013

Related U.S. Application Data

(63) Continuation of application No. 12/926,708, filed on Dec. 6, 2010, now Pat. No. 8,283,728.

(30) Foreign Application Priority Data

Dec. 8, 2009    (JP) .................................. 2009-278757

(51) Int. Cl.
*H01L 27/06*    (2006.01)
*H01L 23/62*    (2006.01)

(52) U.S. Cl.
USPC .................................. 257/358; 257/E27.016

(58) Field of Classification Search
USPC .......................................... 257/358, E27.016
See application file for complete search history.

(56) References Cited

U.S. PATENT DOCUMENTS

2006/0065931 A1    3/2006  Lee et al.
2006/0151836 A1    7/2006  Salcedo et al.
2008/0001168 A1    1/2008  Manna et al.
2008/0062598 A1    3/2008  Chen et al.
2008/0217650 A1    9/2008  Morishita

FOREIGN PATENT DOCUMENTS

JP    2008-218886 A    9/2008

OTHER PUBLICATIONS

Amaerasekera, et al., "ESD in Silicon Integrated Circuits," $2^{nd}$ Edition, John Wiley & Sons Inc. pp. 116-119, 2002.
Morishita, et al. "A Low-Leakage SCR Design Using Trigger-PMOS Modulation for ESD Protection", EOS/ESD Symposium 07-376, 2007.

*Primary Examiner* — David S Blum
(74) *Attorney, Agent, or Firm* — McGinn IP Law Group, PLLC

(57) ABSTRACT

A semiconductor device includes a signal input pad, a protection object circuit, a first connection node connected with the protection object circuit, a first resistance element connected between the signal input pad and the first connection node, a first protection circuit section arranged between a power supply line or a ground line and a second connection node between the signal input pad and the first resistance element, and a second protection circuit section. The second protection circuit section includes at least one of a first PMOS transistor having a source connected with the first connection node, a drain connected with the ground line and a gate and a back gate connected with the power supply line, and a first NMOS transistor having a source connected with said first connection node, a drain connected with the power supply line and a gate and a back gate connected with the ground line.

10 Claims, 19 Drawing Sheets

US 8,558,314 B2

SEMICONDUCTOR DEVICE

INCORPORATION BY REFERENCE

The present application is a Continuation Application of U.S. patent application Ser. No. 12/926,708, now U.S. Pat. No. 8,283,728, filed on Dec. 6, 2010, which is based on and claims priority from Japanese Patent Application No. 2009-278757, filed on Dec. 8, 2009, the entire contents of which is incorporated herein by reference.

TECHNICAL FIELD

The present invention is related to a semiconductor device, and more particularly to a semiconductor device with an electrostatic protection circuit.

BACKGROUND ART

An electrostatic protection circuit is formed in a semiconductor device to protect an internal circuit from electrostatic discharge (ESD) surge which is applied to the input/output pad. FIG. 1 is a block diagram showing an example of a general configuration of a semiconductor device with an electrostatic protection circuit.

The semiconductor device of FIG. 1 is provided with a power supply (VDD) pad 101, a signal input pad 102, a ground (GND) pad 103, a power supply line 104, a signal line 105, a ground line 106, an input circuit 107, and ESD protection elements 109 and 110. The input circuit 107 is provided with a PMOS transistor P1 and an NMOS transistor N1, and has a function to transfer an external input signal, which is received through the signal line 105 from the signal input pad 102, to an internal circuit through a signal line 108. Each of the ESD protection elements 109 and 110 has a function to discharge the ESD surge inputted to the signal input pad 102 to the power supply line 104 or the ground line 106.

A typical element used as the ESD protection element 109 or 110 is an off transistor. The off transistor is a MOS transistor in which a gate voltage is fixed such that the transistor is set to an off state in an ordinary operation, and it is possible to discharge the ESD surge through a parasitic bipolar operation. When an NMOS transistor is used as the off transistor, the drain of the NMOS transistor is connected with the signal line and a source and gate thereof are connected with the ground line. On the other hand, when a PMOS transistor is used as the off transistor, the drain of the PMOS transistor is connected with the signal line and a gate and source thereof are connected with the power supply line. When the ESD surge is applied to the drain of the off transistor, the off transistor discharges the ESD surge through the parasitic bipolar operation. The off transistor functions effectively as the ESD protection element through such a principle.

However, in the ESD protection element using the parasitic bipolar operation, a design window has become small with the miniaturization of the transistor. FIG. 2 is a graph diagram showing relation of breakdown voltage $V_{BD}$ of a gate insulating film and clamp voltage $V_{clamp}$ (voltage while discharge is carried out through the parasitic bipolar operation) when the NMOS transistor operates as a parasitic bipolar. The breakdown voltage $V_{BD}$ decreases rapidly with the decrease of film thickness of the gate insulating film, whereas the clamp voltage $V_{clamp}$ does not fall so much. As a result, a design window of the ESD protection element has become small with reduction of the film thickness of the gate insulating film.

In the electrostatic protection circuit shown in FIG. 1, there is a possibility that when an ESD surge is applied, a voltage $V_{ESD}$ of the ESD surge is applied to a protection target circuit just as it, so that the circuit is destroyed. That is, in the electrostatic protection circuit shown in FIG. 1, if the ESD protection elements 109 and 110 do not function sufficiently when the ESD surge is applied, there is a case that a large stress voltage $V_{stress}$ is applied to the NMOS transistor N1 of the input circuit 107 so that the MOS transistor N1 is destroyed.

As one technique to cope with such a problem, the ESD protection element is provided to carry out discharging in an auxiliary manner so as to relax the applied voltage. The word "auxiliary" means that the ESD surge has smaller discharge ability than the ESD protection element which mainly discharges the ESD surge. In the following description, the ESD protection element which mainly discharges the ESD surge is referred to as a main ESD protection element and the ESD protection element which carries out auxiliary discharge is referred to as a sub ESD protection element. A role of the sub ESD protection element is to form a second discharge route through which a very small part of the discharge current flows, so as to relax a voltage at a critical position, separately from a discharge route which is formed by the main ESD protection element.

FIGS. 3A and 3B are a block diagrams showing configuration examples of a semiconductor device with sub ESD protection elements. In the semiconductor devices shown in FIGS. 3A and 3B, PMOS transistor PP2 and NMOS transistor NN2 are used as the off transistors of the sub ESD protection elements. The PMOS transistor PP2 is provided between a node B on the signal line 105 and the power supply line 104 and the NMOS transistor NN2 is provided between the node B on the signal line 105 and the ground line 106. Moreover, a resistance element R1 is provided between the node B and the signal input pad 102 on the signal line 105. Such a semiconductor device is described in, for example, "ESD in Silicon Integrated Circuits" by Ajith Amerasekera, et al. (John Wiley & Sons Inc (Non-Patent Literature 1) pp. 117-119, FIG. 5.9.

In the semiconductor devices shown in FIGS. 3A and 3B, a discharge route is formed to pass through the resistance element R1 when the ESD surge is applied, and a protection target circuit, especially, the PMOS transistor P1 and the NMOS transistor N1 in the input circuit 107 can be protected by means of a voltage drop of the resistance element R1. In detail, as shown in FIG. 3A, when an ESD surge of a positive polarity to the ground pad 103 is applied to the signal input pad 102 to raise a voltage $V_{ESD}$ between the signal line 105 and the ground line 106, a drain junction of the NMOS transistor NN2 breaks down such that the NMOS transistor NN2 is carries out a parasitic bipolar operation. Thus, a discharge route is formed to pass from the signal input pad 102 to the ground line 6 through the signal line 105, the resistance element R1 and the NMOS transistor NN2. When discharge current $I_{2nd}$ flows through this discharge route, the voltage drop of $I_{2nd} \times R1$ is generated by the resistance element R1. Thus, a relaxation effect of the stress voltage $V_{stress}$ which is applied to the NMOS transistor N1 of the input circuit 107 can be obtained.

In the same way, as shown in FIG. 3B, when an ESD surge of the positive polarity to the power supply pad 101 is applied to the signal input pad 102 to raise the voltage $V_{ESD}$ between the power supply line 104 and the signal line 105, a discharge route is formed to pass from the signal input pad 102 to the power supply line 4 through the signal line 105, and the resistance element R1 and the parasitic diode element which exists between the drain and the back gate in the PMOS transistor PP2. In such an operation, too, the relaxation effect of the stress voltage $V_{stress}$ which is applied to the NMOS transistor N1 and the PMOS transistor P1 in the input circuit 7 can be obtained by the voltage drop of the resistance element R1.

CITATION LIST

1. Patent Literature

[Patent Literature 1]: JP 2008-218886A

2. Non-Patent Literature

[Non-Patent Literature 1]: "ESD in Silicon Integrated Circuits", by Ajith Amerasekera, et al. (John Wiley & Sons Inc)
[Non-Patent Literature 2]: "A Low-Leakage SCR Design Using Trigger—PMOS Modulations for ESD Protection" (EOS/ESD Symposium 07-376)

SUMMARY OF THE INVENTION

However, in the configuration which uses the off transistor as the sub ESD protection element as shown in FIGS. 3A and 3B, a problem of reduction of the above-mentioned design window is not solved. That is, in the configuration of FIGS. 3A and 3B, it is necessary that the drain junction breaks down, in order to start the parasitic bipolar operation, and also a clamp voltage $V_{clamp}$ during the parasitic bipolar operation after the breakdown is as high as about 4 V. On the other hand, in the CMOS semiconductor integrated circuit in the generations of 90 nm or the subsequent, the gate breakdown voltage has become equal to or less than 5 V. In this way, the design window of the sub ESD protection element, too, has become small, and the relaxation effect of the stress voltage $V_{stress}$ is not sufficient in the circuit of FIGS. 3A and 3B.

As one technique to solve such a problem, a circuit is known in which a thyristor is used as the ESD protection element and a trigger current is supplied by a trigger element operating in a low voltage (Patent Literature 1, Non-Patent Literature 2). FIG. 4 is a block diagram of a semiconductor device having such a circuit configuration. An electrostatic protection circuit of FIG. 4 is provided with a power supply (VDD) pad 201, a signal pad 202, a ground (GND) pad 203, a power supply line 204, a signal line 205, a ground line 206, a thyristor 207, a diode D1 for ESD protection, and a PMOS transistor P1.

In the semiconductor device of FIG. 4, the PMOS transistor P1 functions as the trigger element which supplies the trigger current to the thyristor 207 which functions as a main protection element. In detailed, when the ESD surge is applied to the signal pad 202, the PMOS transistor P1 is turned on to supply thyristor 207 with the trigger current. The PMOS transistor P1 performs not the parasitic bipolar operation but the operation of usual MOS transistor and supplies the trigger current. Therefore, the electrostatic protection circuit of FIG. 4 can operate in a low voltage (specifically, a summation of a forward voltage of a PN junction contained in the thyristor 207 and a threshold voltage of the MOS transistor). In addition, because the thyristor 207 is used, a large current can be passed and the electrostatic protection ability is large.

However, in the circuit of FIG. 4, the PMOS transistor P1 functions only as the trigger element of the thyristor 207, and the surge voltage applied to the signal pad 202 is applied to the internal circuit just as it is. That is, the PMOS transistor P1 does not function as a sub ESD protection element to relax the stress voltage applied to the internal circuit.

In an aspect of the present invention, a semiconductor device includes: a power supply line supplied with a power supply voltage, a power supply pad connected with the power supply line, a ground line, a ground pad connected with the ground line, a signal input pad, a protection object circuit, a first connection node connected with the protection object circuit, a first resistance element connected between the signal input pad and the first connection node, a first protection circuit section arranged between the power supply line or the ground line and a second connection node between the signal input pad and the first resistance element, and a second protection circuit section, wherein the second protection circuit section includes at least one of a first PMOS transistor having a source connected with the first connection node, a drain connected with the ground line and a gate and a back gate connected with the power supply line, and a first NMOS transistor having a source connected with the first connection node, a drain connected with the power supply line and a gate and a back gate connected with the ground line.

In such a configuration, when an ESD surge is applied, the PMOS transistor and/or the NMOS transistor in the sub protection circuit section operate in a relatively low voltage (a voltage substantially equal to the threshold voltage of the MOS transistor) to form a discharge route which passes a resistance element and the sub protection circuit section. When a discharge current flows through this discharge route, a voltage drop due to the resistance element reduces the voltage difference between the connection node and the ground line or the power supply line so that a protection object circuit is effectively protected.

According to the present invention, the electrostatic protection circuit is provided which can discharge the ESD surge in a low operation voltage while relaxing a stress voltage which is applied to a protection object circuit.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

First Embodiment

Figure 5A:
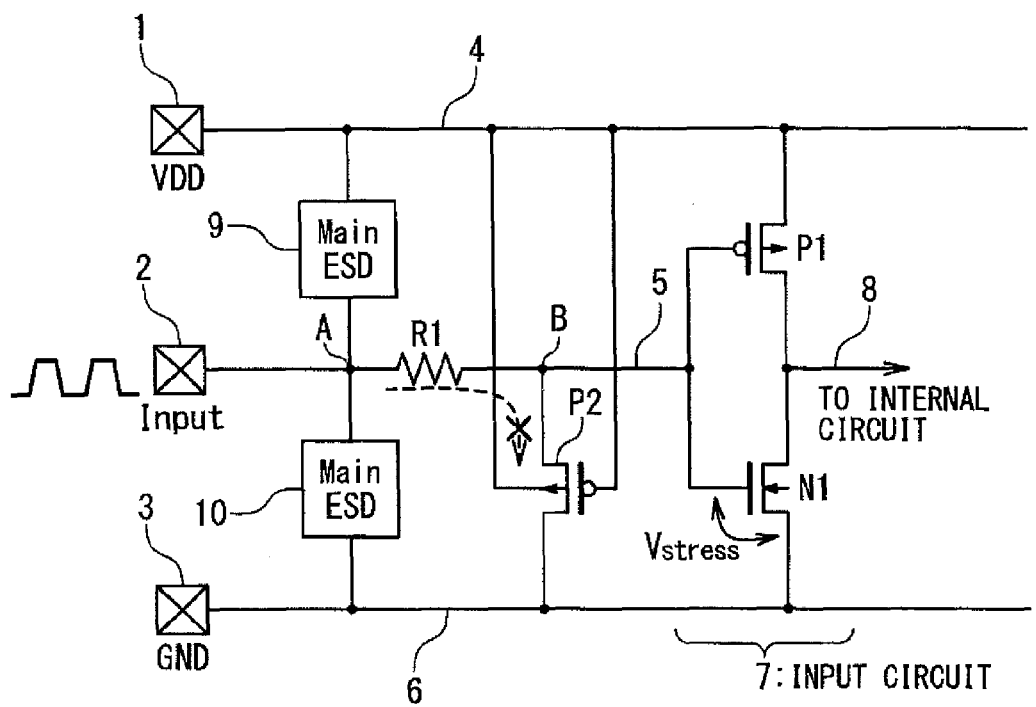
FIG. 5A is a block diagram showing a configuration of a semiconductor device according to a first embodiment of the present invention.

FIG. 5A is a block diagram showing a configuration of a semiconductor device according to a first embodiment of the present invention, especially, the configuration of an electrostatic protection circuit integrated in the semiconductor device. In this embodiment, the semiconductor device is provided with a power supply (VDD) pad 1, a signal input pad 2, a ground (GND) pad 3, a power supply line (a high voltage side power supply line) 4, a signal line 5 and a ground line (a low voltage side power supply line) 6. The power supply line 4 may be supplied with a power supply voltage directly from the power supply pad 1 or through a power supply node from a regulator (not shown) which is connected with the power supply pad 1. In the following description, description will be performed as use of the power supply pad 1 for both of a case of the power supply pad and a case of the power supply node. The power supply pad 1 and the ground pad 3 are connected with the power supply line 4 and the ground line 6, respectively, and the signal input pad 2 is connected with a node A on the signal line 5. The signal input pad 2 is an external connection pad to receive an external signal, and the signal line 5 supplies the signal inputted to signal input pad 2 to an input circuit 7. The input circuit 7 is configured as a buffer which is provided with a PMOS transistor P1 and an NMOS transistor N1. The PMOS transistor P1 has a gate connected with a node B on the signal line 5, a drain connected with a signal line 8 which is connected with an internal circuit and a source connected with the power supply line 4. On the other hand, the NMOS transistor N1 has a gate connected with the node B of the signal line 5, a drain connected with the signal line 8 and a source connected with the ground line 6.

In order to protect the input circuit 7, especially, the NMOS transistor N1 of the input circuit 7, main ESD protection elements 9 and 10, PMOS transistor P2 and a resistance element R1 are provided. The resistance element R1 may be realized by a resistor or a resistance component of interconnections and so on. The main ESD protection element 9 is inserted between the node A of the signal line 5 and the power supply line 4 and the main ESD protection element 10 is inserted between the node A of the signal line 5 and the ground line 6. The PMOS transistor P2 has a source connected with the node B of the signal line 5, a drain connected with the ground line 6 and a gate and a back gate are connected with the power supply line 4. The resistance element R1 is inserted between the node A of the signal line 5 and the node B.

It should be noted that the PMOS transistor P2 is connected between the signal line 5 and the ground line 6. Generally, when the off transistor of the PMOS transistor is used as the ESD protection element, the PMOS transistor is provided between the signal line and the power supply line. However, in this embodiment, the connection is different from a general state.

The main ESD protection elements 9 and 10 configure a main protection circuit section which has a role to pass the discharge current to the power supply line 4 or the ground line 6 when the ESD surge is applied to the signal input pad 2. The main ESD protection elements 9 and 10 are configured to pass a large current.

On the other hand, the PMOS transistor P2 is a sub ESD protection element which is inserted additionally for a purpose to relax a stress voltage applied to the input circuit 7. The sub protection circuit section is configured by the PMOS transistor P2 to discharge additionally when the ESD surge is applied to the signal input pad 2. The PMOS transistor P2 is configured to pass a relatively small current, compared with the main ESD protection elements 9 and 10. To be described later, the PMOS transistor P2 provides a route through which the small current is supplied to the resistance element R1 when the ESD surge is applied to the signal input pad 2. The PMOS transistor P2 has a role to protect elements of the input circuit 7, especially, the NMOS transistor N1 by the voltage drop by the resistance element R1.

Below, an operation of the semiconductor device in the present embodiment, especially, an operation of the PMOS transistor P2 of the sub protection circuit section will be described in detail.

First, the operation in an ordinary operation state will be described. Generally, a requisition to the PMOS transistor P2 in the ordinary operation state is that the PMOS transistor P2 is in the off state and an off leakage current is small. To be described in detail below, the circuit shown in FIG. 5A meets such a requisition.

Specifically, in the ordinary operation state, the power supply line 4 is fixed on the voltage VDD and the ground line 6 is fixed on the ground voltage GND, as well as a signal with the amplitude from the voltage VDD to the ground voltage GND is inputted to the signal input pad 2. In this case, because a source voltage (voltage at the node B) of the PMOS transistor P2 is equal to or lower than a gate voltage (the voltage VDD), the PMOS transistor P2 is in the off state.

Here, it should be noted that a voltage (voltage VDD) of the back gate of the PMOS transistor P2 is higher than the source voltage (the voltage at the node B) in the ordinary operation state. Thus, the absolute value of a threshold voltage of the PMOS transistor P2 becomes large due to the back gate effect, so that the off leakage current of the PMOS transistor P2 becomes small. The reduction of the leakage current due to the back gate effect is effective especially when the semiconductor device in the present embodiment is used as an input interface of a differential small amplitude signal. When the differential small amplitude signal is inputted, a bias voltage (a common mode voltage) is fixed on a middle voltage between the voltage VDD and the ground voltage GND and also the external input signal is supplied as the small amplitude signal to the bias voltage. Therefore, the back gate effect is effective and the merit of the reduction of the off leakage current can be received furthermore.

Figure 5B:
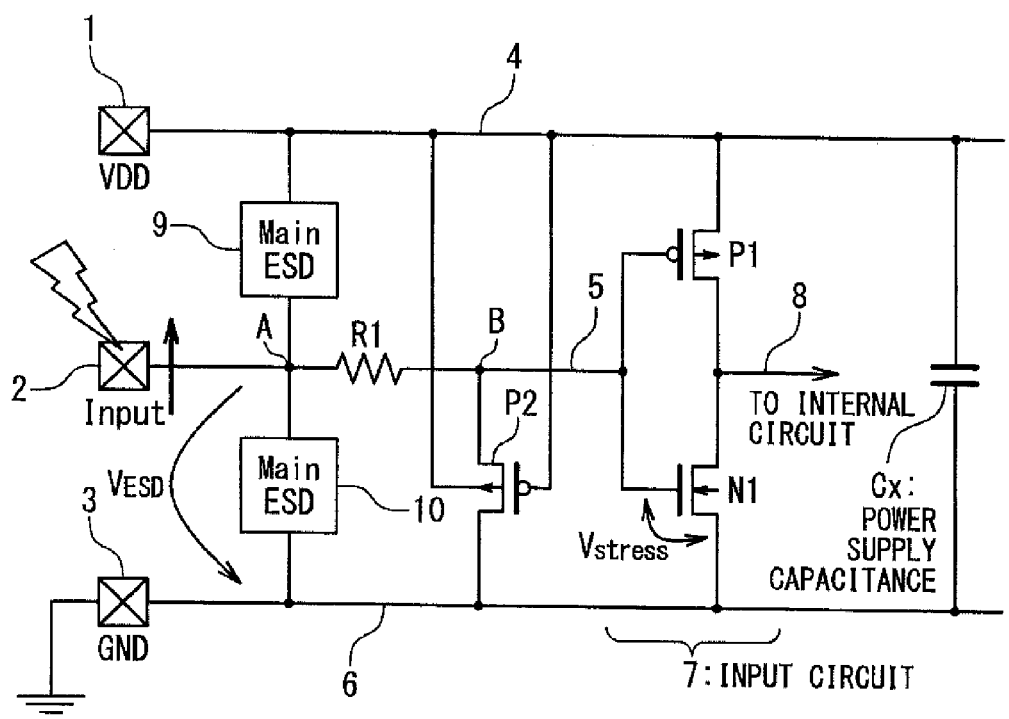
FIGS. 5B and 5C are block diagrams showing operations of the semiconductor device in the first embodiment when an ESD surge of a positive polarity to a ground pad is applied to a signal input pad.
Figure 5C:
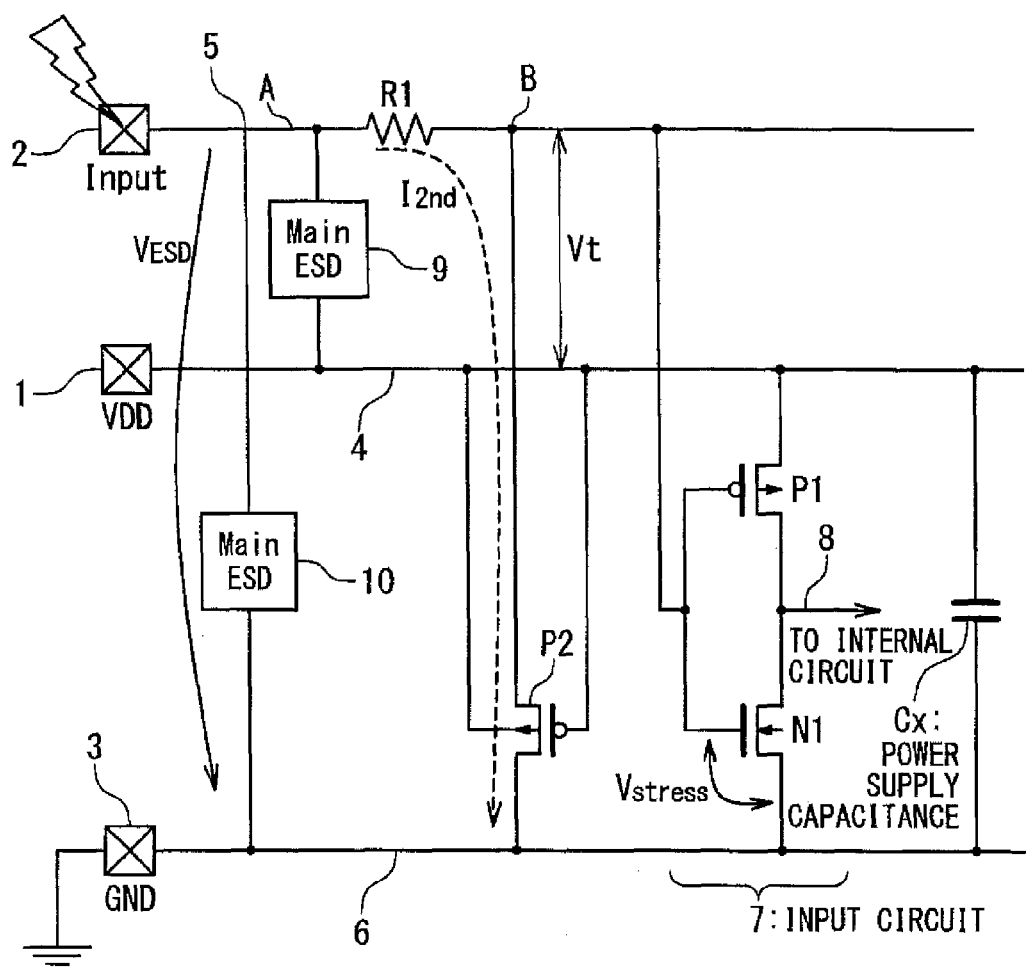

On the other hand, FIGS. 5B and 5C show the operation when an ESD surge of a positive polarity to the ground pad 3 is applied to the signal input pad 2. In this case, it should be noted that a power supply voltage is not supplied to the power supply line 4 but the power supply line 4 is in a floating state. In FIGS. 5B and 5C, Cx is a parasitic capacitance or a power supply capacitance intentionally provided between the power supply line 4 and the ground line 6. The voltage of the power supply line 4 does not rise until the power supply capacitance Cx is charged.

Figure 5D:
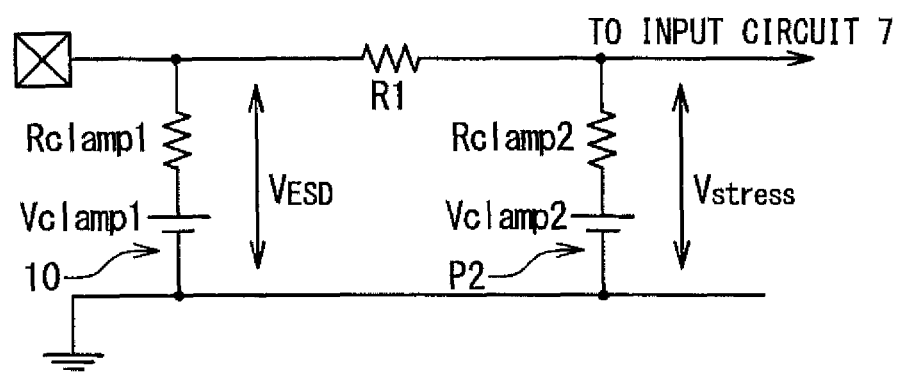
FIG. 5D is an equivalent circuit diagram showing the operation of the semiconductor device in the first embodiment.

When the ESD surge is applied, the voltage $V_{ESD}$ between the signal line 5 and the ground line 6 rises while discharge is performed by the main ESD protection elements 9 and 10. The voltage $V_{ESD}$ rises whereas the power supply line 4 is pulled down to the ground voltage GND by the power supply capacitance Cx. Therefore, the voltage of the signal line 5 becomes higher than the voltage of the power supply line 4 as shown in FIG. 5C. When the voltage difference between the signal line 5 and the power supply line 4 exceeds the threshold voltage Vt of the PMOS transistor P2, the PMOS transistor P2 is turned on and a MOS transistor operation is performed. When the PMOS transistor P2 is turned on, the discharge route is formed from the signal input pad 2 to the ground line 6 through the signal line 5, the resistance element R1 and the PMOS transistor P2. When a discharge current $I_{2nd}$ flows through the discharge route, the voltage at the node B falls lower than that of the node A due to the voltage drop by the resistance element R1, so that the stress voltage $V_{stress}$ applied between the gate and source of the NMOS transistor N1 is reduced, as shown in FIG. 5D. Thus, the destruction of the NMOS transistor N1 is effectively prevented. It should be noted that only a small portion of the discharge current due to the application of The ESD surge flows through the discharge route which passes through the PMOS transistor P2 and a large portion of the discharge current flows through the discharge route passing through the main ESD protection element 10.

Figure 6:
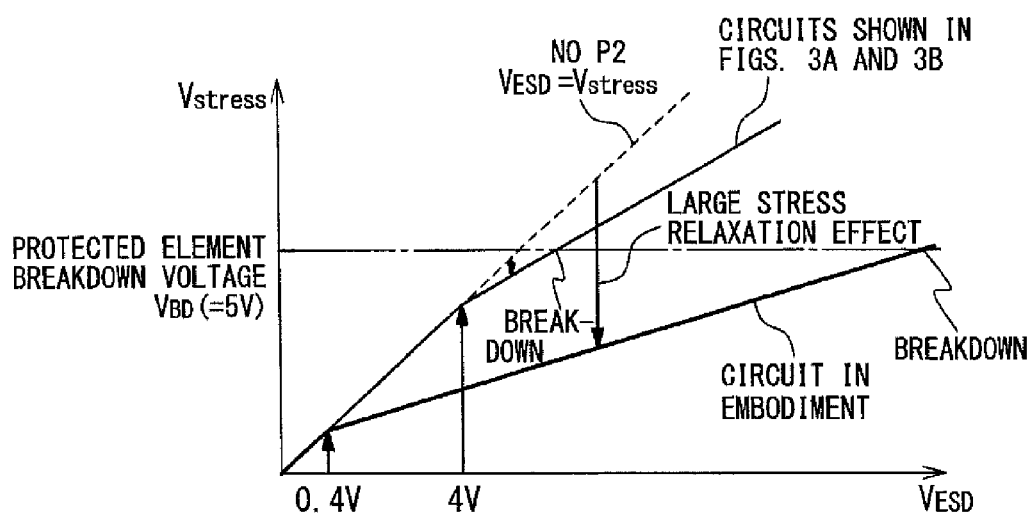
FIG. 6 is a graph diagram showing stress relaxation effect in the circuit configuration shown in FIGS. 3A and 3B and in the circuit configuration in the first embodiment.

In the operation of FIG. 5C, it is important that the PMOS transistor P2 provides a discharge route through the ordinary MOS operation (and not through a parasitic bipolar operation). By the PMOS transistor P2 performing the MOS operation in the low voltage, the protection of the NMOS transistor N1 is effective. This could be understood from FIG. 6 showing the comparison between the relaxation effect of the stress voltage $V_{stress}$ by the configuration of FIGS. 3A and 3B and the relaxation effect of the stress voltage $V_{stress}$ by the configuration of the present embodiment. FIG. 6 shows the operation when the ESD surge of the positive polarity to the ground pad 3 is applied to the signal input pad 2, and the graph represents the breakdown voltage $V_{BD}$ of the NMOS transistor N1 to be protected is 5 V.

Figure 1:
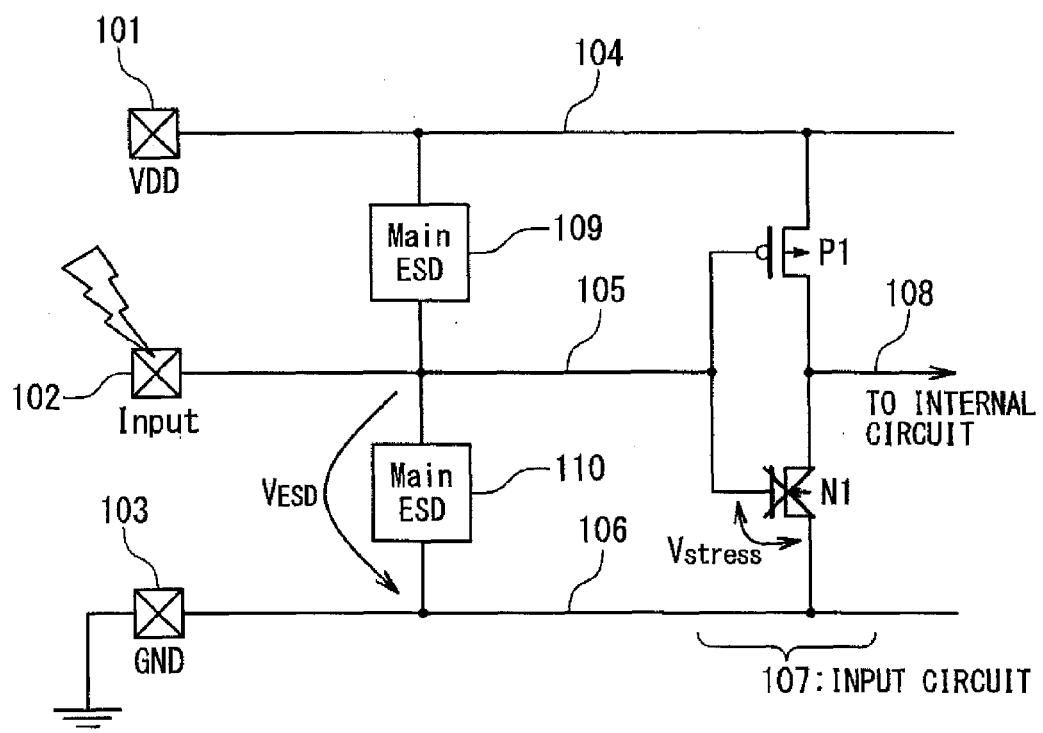
FIG. 1 is a block diagram showing a general configuration of a conventional semiconductor device with an electrostatic protection circuit.
Figure 2:
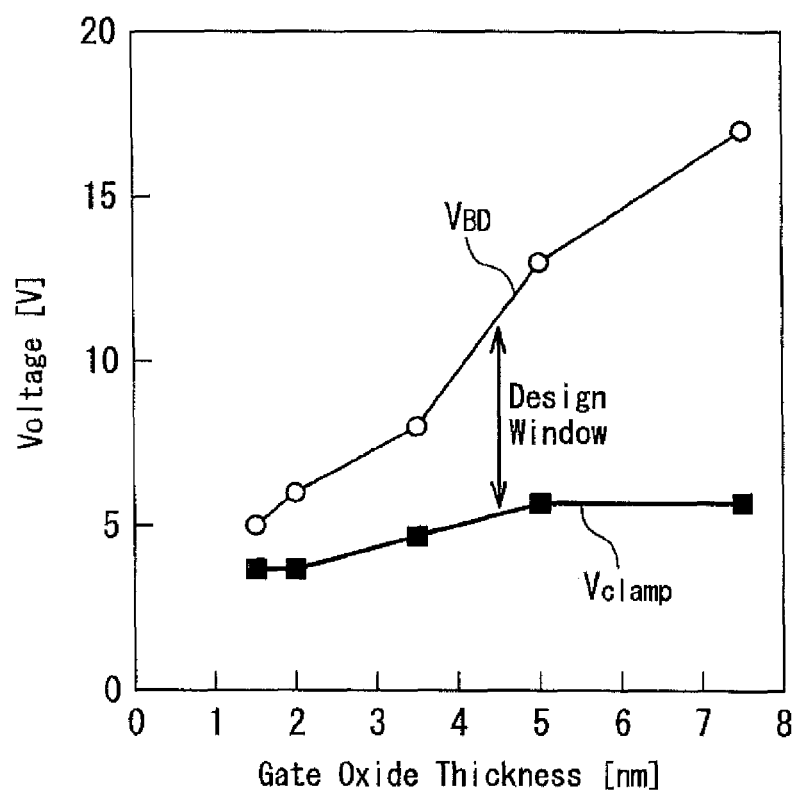
FIG. 2 is a graph diagram showing a relation of breakdown voltage VBD of a gate insulating film and a clamp voltage Vclamp when an NMOS transistor performs as a parasitic bipolar operation in a conventional example.
Figure 3A:
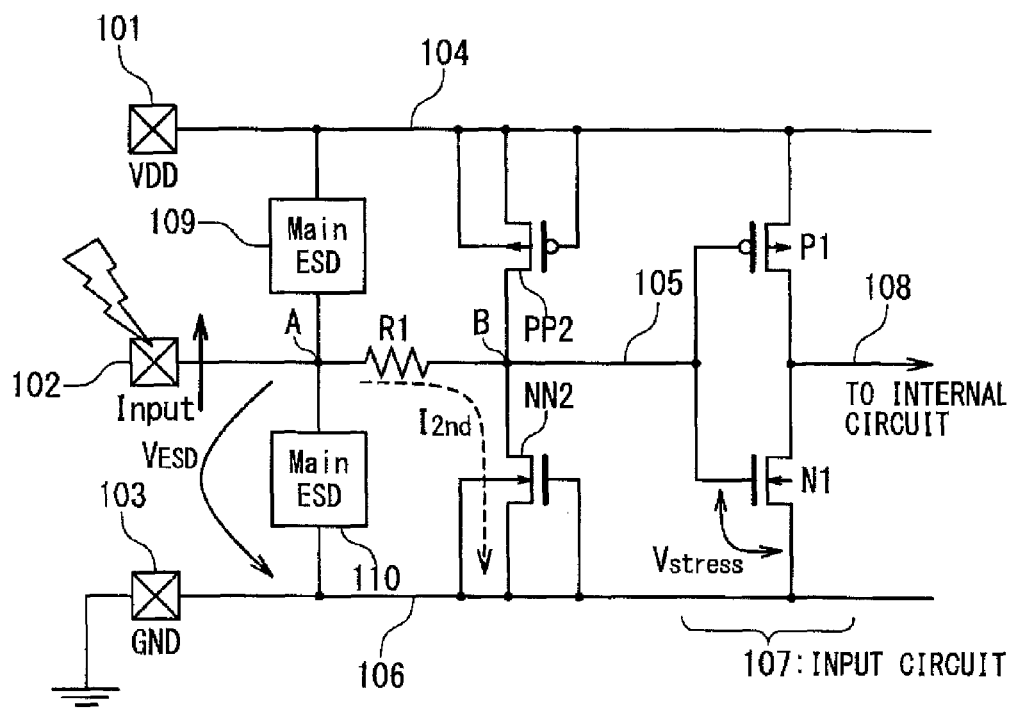
FIGS. 3A and 3B are block diagrams showing operations of a conventional semiconductor device in a case of using an off transistor as a sub ESD protection element.
Figure 3B:
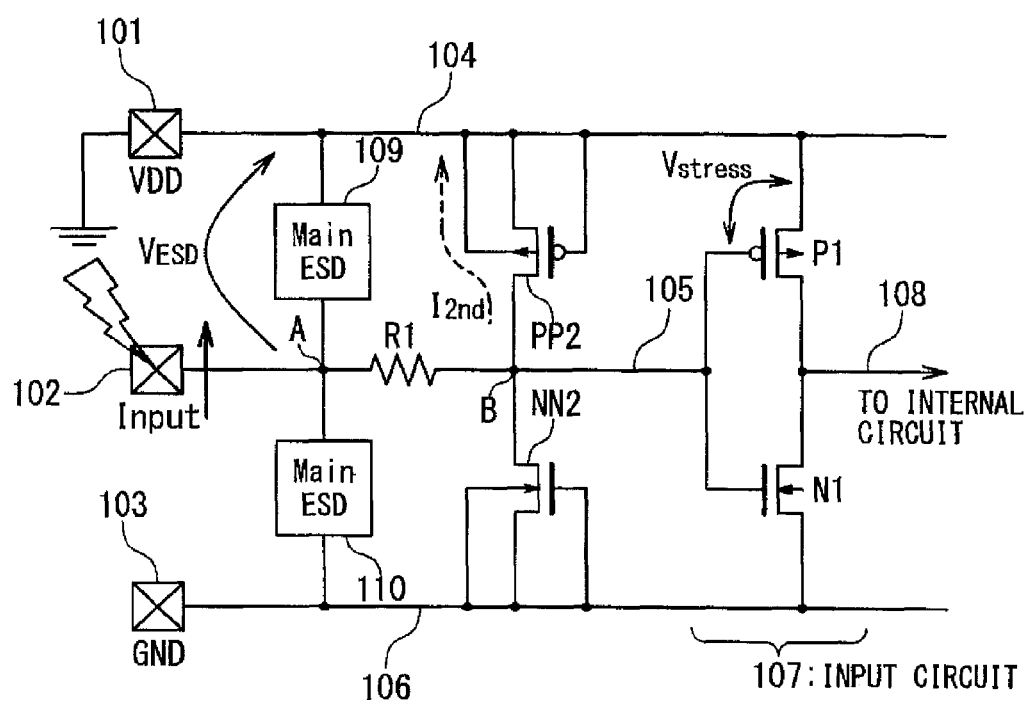
Figure 4:
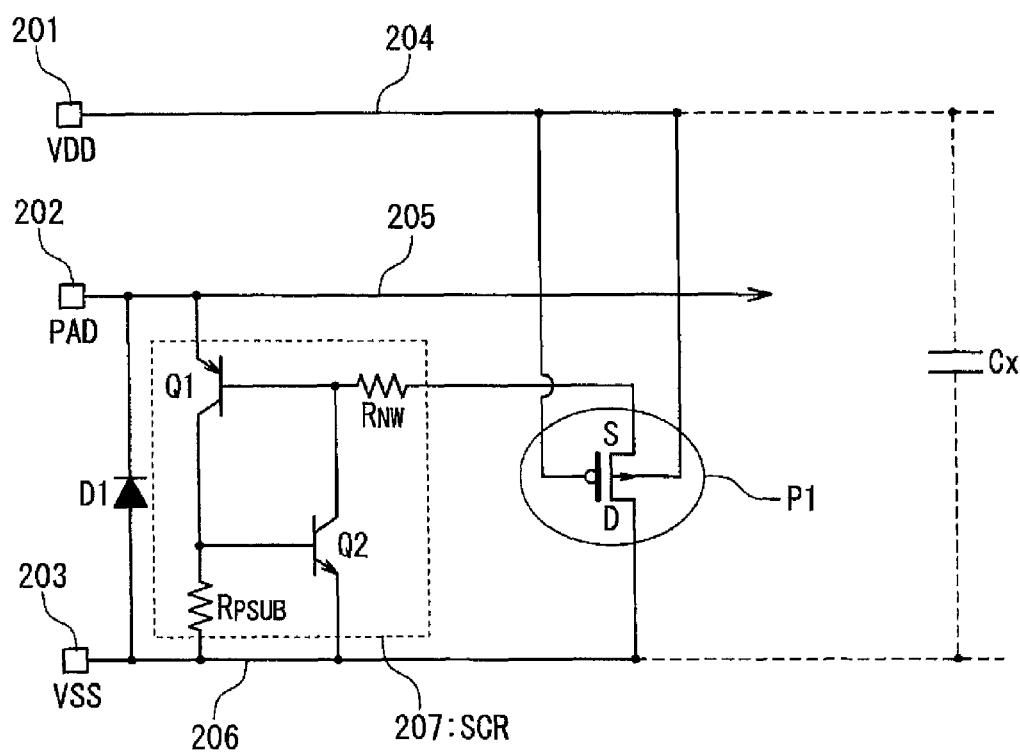
FIG. 4 is a block diagram showing a configuration of a conventional semiconductor device with an electrostatic protection circuit.

In the configuration of FIGS. 3A and 3B, the voltage $V_{ESD}$ and the voltage $V_{stress}$ which is applied to the gate of the NMOS transistor N1 to be protected are equal to each other until the voltage $V_{ESD}$ between the signal line 5 and the ground line 6 rises to 4 V at which the NMOS transistor NN2 performs a parasitic bipolar operation. Because the difference between the voltage when the NMOS transistor NN2 operates and the breakdown voltage $V_{BD}$ is small though the relaxation effect of the voltage $V_{stress}$ is obtained when the NMOS transistor NN2 operates, the voltage reaches the breakdown voltage $V_{BD}$ immediately after the voltage $V_{ESD}$ rises. That is, in the configuration of FIGS. 3A and 3B, the relaxation effect of the voltage $V_{stress}$ is not sufficient.

On the other hand, in the present embodiment, because the PMOS transistor P2 operates in the low voltage, the rise of voltage $V_{ESD}$ is suppressed so that the voltage $V_{ESD}$ never reaches the breakdown voltage $V_{BD}$ immediately. That is, the large relaxation effect is obtained by the configuration of the present embodiment and the sufficient ESD protection effect is obtained.

Or, in the present embodiment, the sufficient ESD protection effect is obtained even if the resistance value of the resistance element R1 is small. The relaxation effect of the voltage $V_{stress}$ after the NMOS transistor NN2 operates in the configuration of FIGS. 3A and 3B or the PMOS transistor P2 operates in the present embodiment depends on the resistance value of the resistance element R1. When the resistance value of the resistance element R1 is larger, the relaxation effect is larger. Referring to the graph of FIG. 6, as the resistance value of the resistance element R1 is larger, the inclination of a straight line which shows a change of the voltage $V_{stress}$ to the voltage $V_{ESD}$ becomes smaller so that the relaxation effect becomes larger. In the present embodiment, because the difference between the voltage $V_{ESD}$ when the PMOS transistor P2 operates and the breakdown voltage $V_{BD}$ is larger, a necessary relaxation effect is obtained even if the resistance value of the resistance element R1 is small, that is, even if the inclination of the line which shows the change of the voltage $V_{stress}$ to the voltage $V_{ESD}$ is large. It is desirable that the resistance value of the resistance element R1 is small, because the high frequency characteristic can be improved when the circuit of the present embodiment is applied to a high speed and high frequency circuit.

In the circuit configuration shown in FIGS. 5A to 5C in the present embodiment, when the clamp voltage of the PMOS transistor P2 functioning as the sub ESD protection element is too small as compared with the clamp voltage of the main ESD protection elements 9 and 10, a large portion of the discharge current flows into the PMOS transistor P2 so that the PMOS transistor P2 is destroyed before the main ESD protection elements 9 and 10 operate.

However, the above problem is not important actually. The use of a thyristor-type protection element becomes possible with a miniaturization progress and use of a low power supply voltage, and thus, a voltage rise at the time of the discharge can be suppressed below about 7 V. In addition, it could be expected that the operation voltage of the main ESD protection elements 9 and 10 further becomes lower with the progress of further miniaturization and use of the further lower power supply voltage. If the PMOS transistor P2 is used which operation start voltage is substantially equal to the threshold voltage in the present embodiment when the main ESD protection elements 9 and 10 are used which have the low clamp voltage of about 7 V, the difference between the clamp voltage of the main ESD protection elements 9 and 10 and the clamp voltage of the PMOS transistor P2 becomes as small as about 6 V and the destruction of the PMOS transistor P2 does not happen.

For example, it is supposed that the discharge current of the ESD surge is about 3 A which is a peak current value which is defined in the ESD examination of 200 V of the Machine Model standard and 3% of the whole discharge current (=90 mA) flows into the PMOS transistor P2. In this case, if the resistance value of the resistance element R1 connected in serial with the PMOS transistor P2 is 50Ω, the 4.5-V voltage drop is caused by the resistance element R1 and only the voltage stress of about 1.5V (=6.0−4.5V) is applied to the PMOS transistor P2. It is possible to realize the PMOS transistor P2 which can endure the current stress of about 90 mA and the voltage stress of about 1.5 V, if a gate width of about 10 µm is employed even in the MOS transistor of 40-nm generation. Also, if the resistance element R1 is 50Ω, the influence of the circuit characteristic of the resistance element R1 can be ignored, even if the circuit configuration of the present embodiment is used in the high-speed interface which operates at the frequency of 1 GHz or more. In this way, according to the circuit configuration of the present embodiment, the ESD protection of the high-speed interface in the fine CMOS circuit of the 40-nm generation can be realized.

Figure 7:
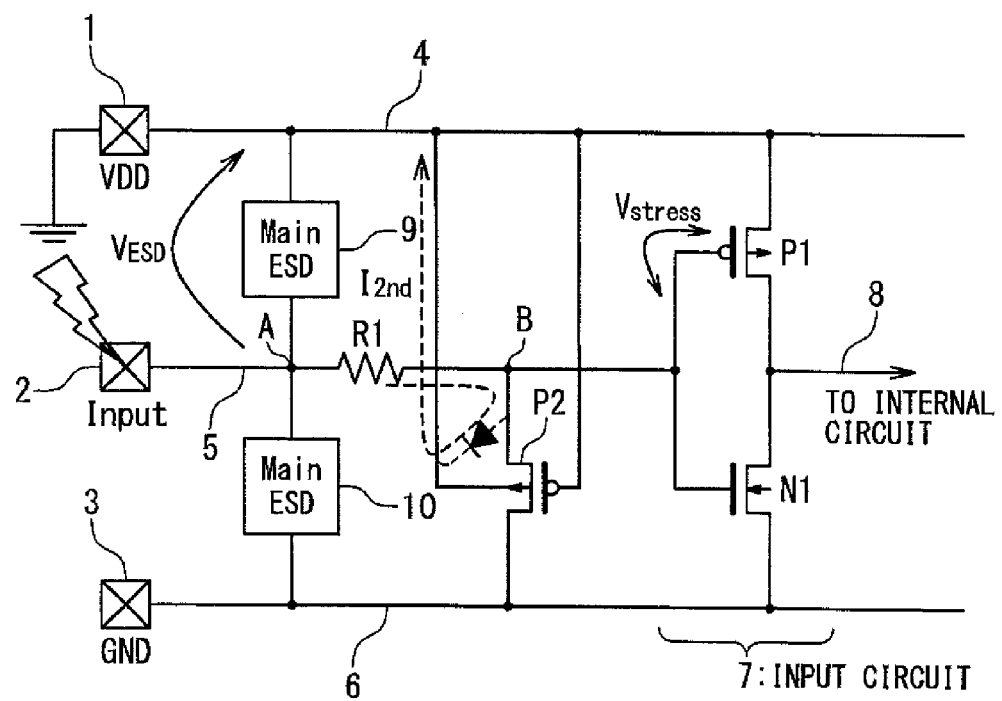
FIG. 7 is a block diagram showing an operation of the semiconductor device in the first embodiment when an ESD surge of the positive polarity to a power supply voltage pad is applied to the signal input pad in the first embodiment.

On the other hand, in the circuit configuration of the present embodiment, even when the ESD surge of the positive polarity to the power supply pad 1 is applied to the signal input pad 2, the PMOS transistor P2 operates so that the voltage stress $V_{stress}$ of the PMOS transistor P1 of input circuit 7 can be reduced. FIG. 7 shows the operation of the semiconductor device in the present embodiment when the ESD surge of the positive polarity to the power supply pad 1 is applied to the signal input pad 2. In this case, a forward voltage is applied to the parasitic diode element which exists between the drain and the back gate in the PMOS transistor P2. By this parasitic element device turning on, a discharge route to discharge the discharge current is formed from the signal input pad 2 to the power supply line 4 through the signal line 5, the resistance element R1 and the PMOS transistor P2. The voltage stress $V_{stress}$ of the PMOS transistor P1 of input circuit 7 can be reduced due to the voltage drop generated by the discharge current flowing through the resistance element R1.

Second Embodiment

Figure 8:
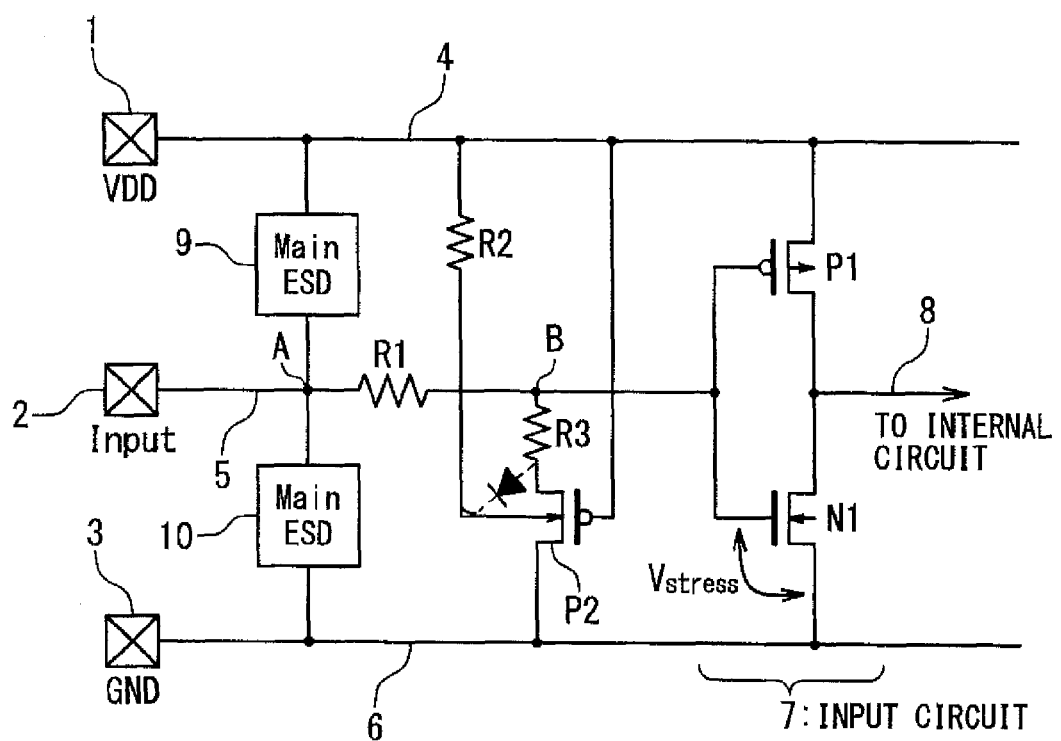
FIG. 8 is a block diagram showing a configuration of the semiconductor device according to a second embodiment of the present invention.

FIG. 8 is a block diagram showing the configuration of the semiconductor device according to a second embodiment of the present invention. In when a further high speed operation of 10 GHz or more is considered, it is necessary in the circuit configuration of the first embodiment that a parasitic capacitance of the main ESD protection element is largely reduced and with it, the size of the main ESD protection element is reduced. In this case, there is a possibility that the discharge ability of the main ESD protection element reduces so that an excess discharge current flows into the PMOS transistor P2. In such a case, the PMOS transistor P2 which functions as the sub ESD protection element is destroyed sometimes. In order to cope with this, in the second embodiment, a technique to prevent the excess discharge current from flowing through the PMOS transistor P2 is applied to a section of the PMOS transistor P2.

More specifically, a resistance element R2 is inserted between the back gate of the PMOS transistor P2 and the power supply line 4 and a resistance element R3 is inserted between the node B of the signal line 5 and the ground line 6 in serial with the PMOS transistor P2. In FIG. 8, the resistance element R3 is inserted between the source of the PMOS transistor P2 and node B but the resistance element R3 may be inserted between the drain of the PMOS transistor P2 and the ground line 6. An amount of the discharge current which flows through the PMOS transistor P2 can be intentionally limited by the resistance elements R2 and R3 to prevent the destruction of the PMOS transistor P2. It should be noted that in FIG. 8, two resistance elements of the resistance elements R2 and R3 are inserted but only either may be inserted.

Third Embodiment

Figure 9A:
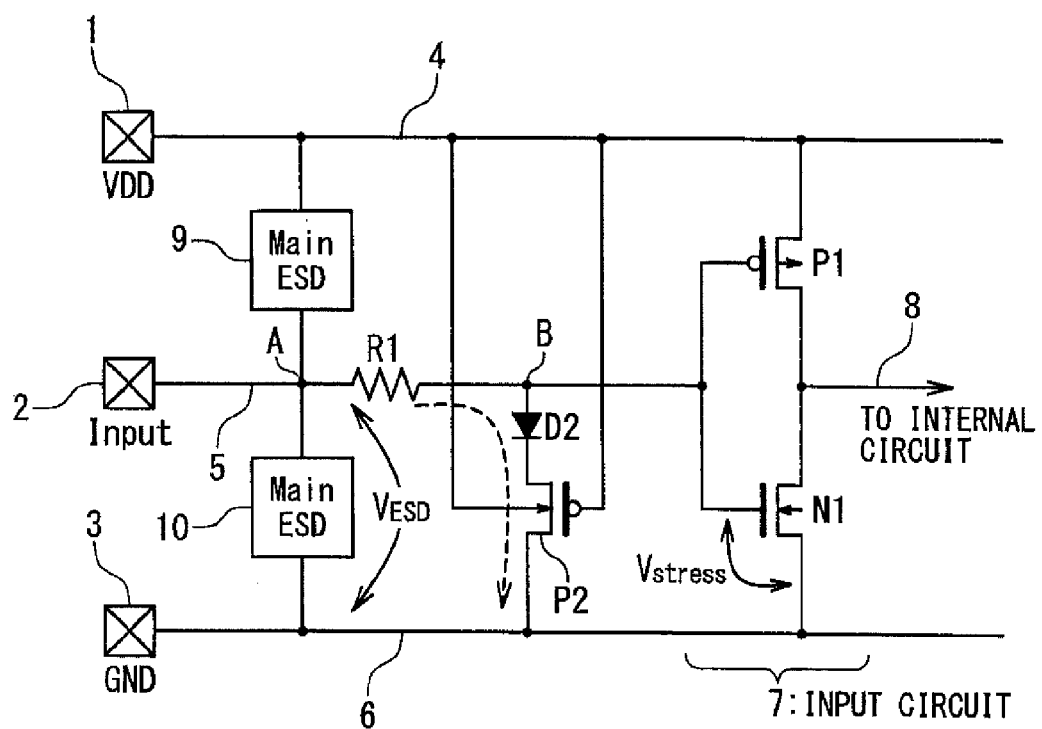
FIG. 9A is a block diagram showing the configuration of the semiconductor device according to a third embodiment of the present invention.

FIG. 9A is a block diagram showing the configuration of the semiconductor device according to a third embodiment of the present invention. In the third embodiment, a diode D2 is inserted between the node B of the signal line 5 and the ground line 6 in serial with the PMOS transistor P2. The diode D2 is inserted to direct from the node B of the signal line 5 to the ground line 6 in the forward direction.

The diode D2 has a role to prevent the PMOS transistor P2 from malfunctioning when the voltage of the signal input pad 2 becomes higher because of noise and so on than that of the power supply voltage in the ordinary operation. The voltage of the signal input pad 2 is the power supply voltage at a maximum when it operates ordinarily but it sometimes exceeds the power supply voltage VDD because of noise and so on. In the configuration of the first embodiment, the malfunction that the PMOS transistor P2 is turned on in the ordinary operation can happen, when the noise level is high so that the voltage at the node B of the signal line 5 exceeds a summation of the power supply voltage VDD and the threshold voltage Vt of the PMOS transistor P2.

The diode D2 has a role to prevent the malfunction of the PMOS transistor P2 effectively. In the configuration shown in FIG. 9A in which the diode D2 is inserted, the operation voltage of the PMOS transistor P2 rises by the forward voltage Vf of the diode D2 so that it becomes difficult for the malfunction to happen. The number of diodes D2 to be inserted in FIG. 9A is one but by inserting N diodes D2, the operation voltage of the PMOS transistor P2 may rise by N×Vf. The number of diodes D2 to be inserted is sufficient to be adjusted in accordance to the operation voltage of the PMOS transistor P2.

Figure 9B:
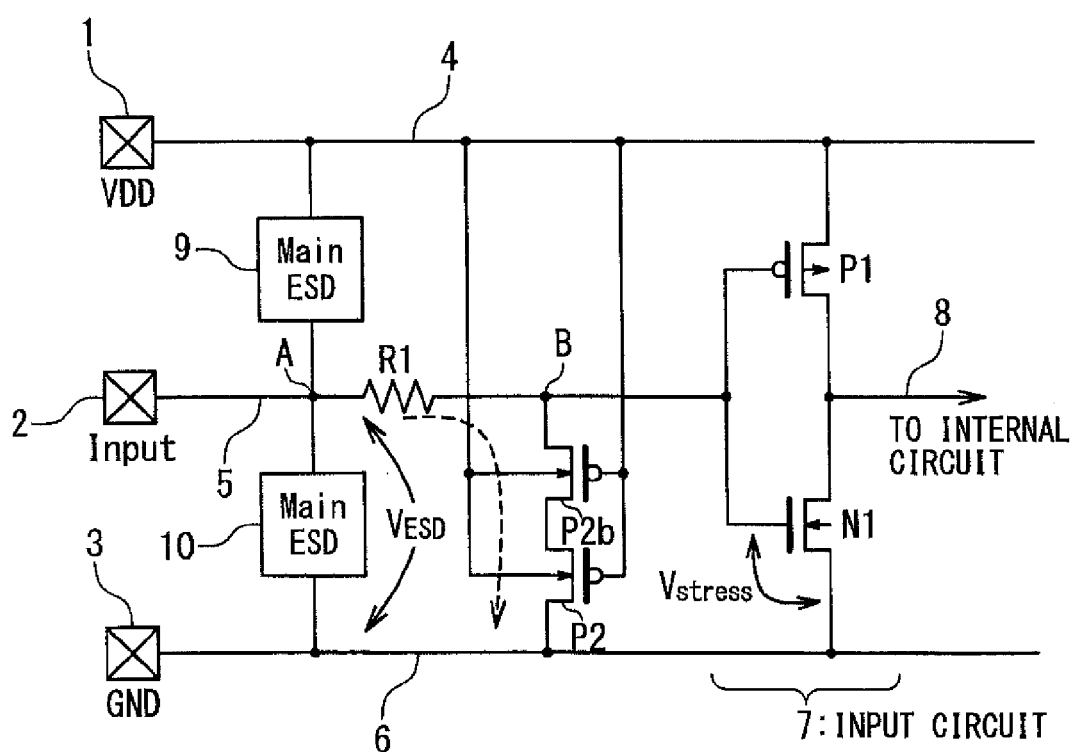
FIG. 9B is a block diagram showing another configuration of the semiconductor device according to the third embodiment of the present invention.

Instead of the diode D2, one or more PMOS transistors may be inserted. FIG. 9B shows a configuration in which one PMOS transistor P2b is inserted between the node B of the signal line 5 and the ground line 6 in serial with the PMOS transistor P2. Generally, when N of the PMOS transistor P2b are inserted, the voltage at the node B when the PMOS transistors P2 and P2b of P operate is VDD+(N+1)×Vt and a malfunction can be restrained effectively.

Fourth Embodiment

Figure 10:
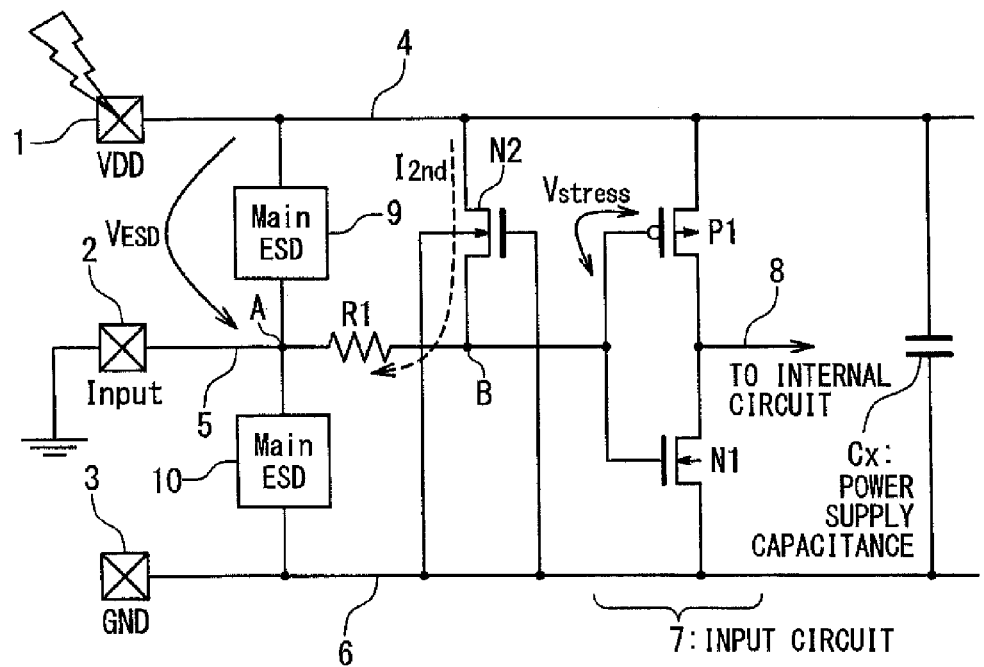
FIG. 10 is a block diagram showing a configuration of the semiconductor device according to a fourth embodiment of the present invention.

FIG. 10 is a block diagram showing the configuration of the semiconductor device according to a fourth embodiment of the present invention. In the present embodiment, as the sub ESD protection element, an NMOS transistor N2 is provided instead of the PMOS transistor P2. The NMOS transistor N2 has a drain connected with the power supply line 4, a source is connected with the node B of the signal line 5 and a gate and back gate connected with the ground line 6.

The configuration in the fourth embodiment can protect the destruction of the PMOS transistor P1 of the input circuit 7, like the first embodiment. That is, an ESD surge of the positive polarity to the signal input pad 2 is applied to power supply pad 1, the NMOS transistor N2 performs a MOS operation to turn on, so that a discharge route is formed from the power supply pad 1 to the signal input pad 2 through the power supply line 4, the NMOS transistor N2, and the resistance element R1. When the discharge current flows through the resistance element R1, the voltage at the node B on the signal line 5 rises so that the voltage difference between the power supply line 4 and node B becomes small. That is, the stress voltage $V_{stress}$ which is applied between the source and the gate in the PMOS transistor P2 of the input circuit 7 is reduced.

Figure 11:
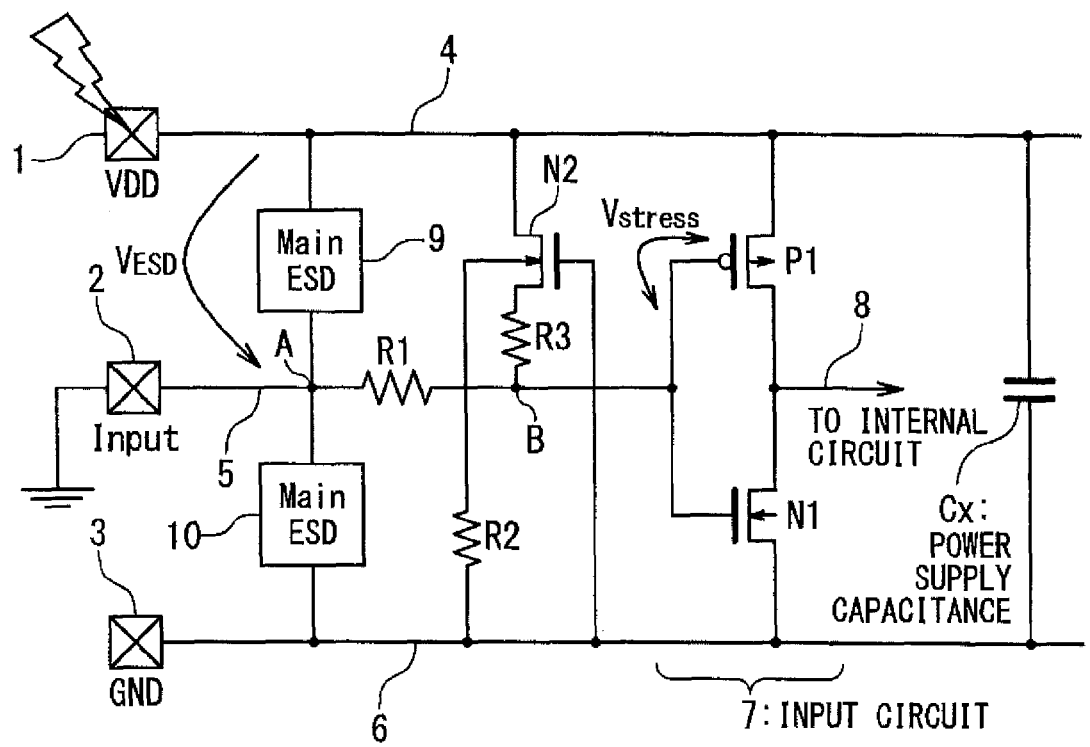
FIG. 11 is a block diagram showing another configuration of the semiconductor device according to the fourth embodiment of the present invention.

Also, referring to FIG. 11, like the second embodiment, when the NMOS transistor N2 is used as the sub ESD protection element, the NMOS transistor N1 can be protected from an excess discharge current by inserting the resistance elements R2 and R3. More specifically, the resistance element R2 is inserted between the back gate of the NMOS transistor N2 and the ground line 6 and the resistance element R3 is inserted between the node B on the signal line 5 and the power supply line 4 in serial with the NMOS transistor N2.

Figure 12A:
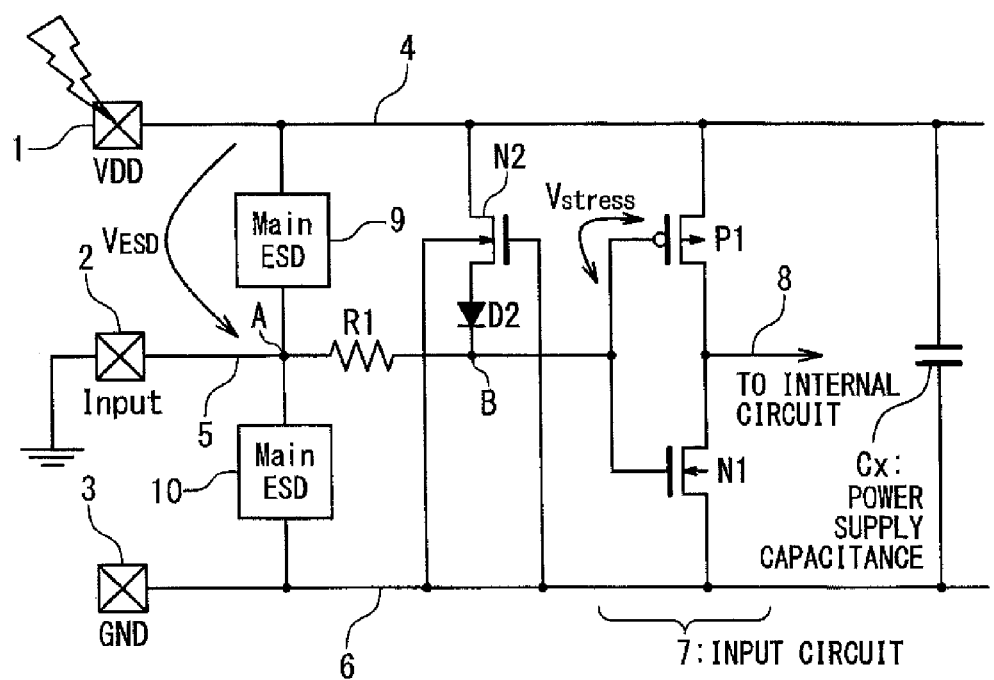
FIG. 12A is a block diagram showing still another configuration of the semiconductor device according to the fourth embodiment of the present invention.
Figure 12B:
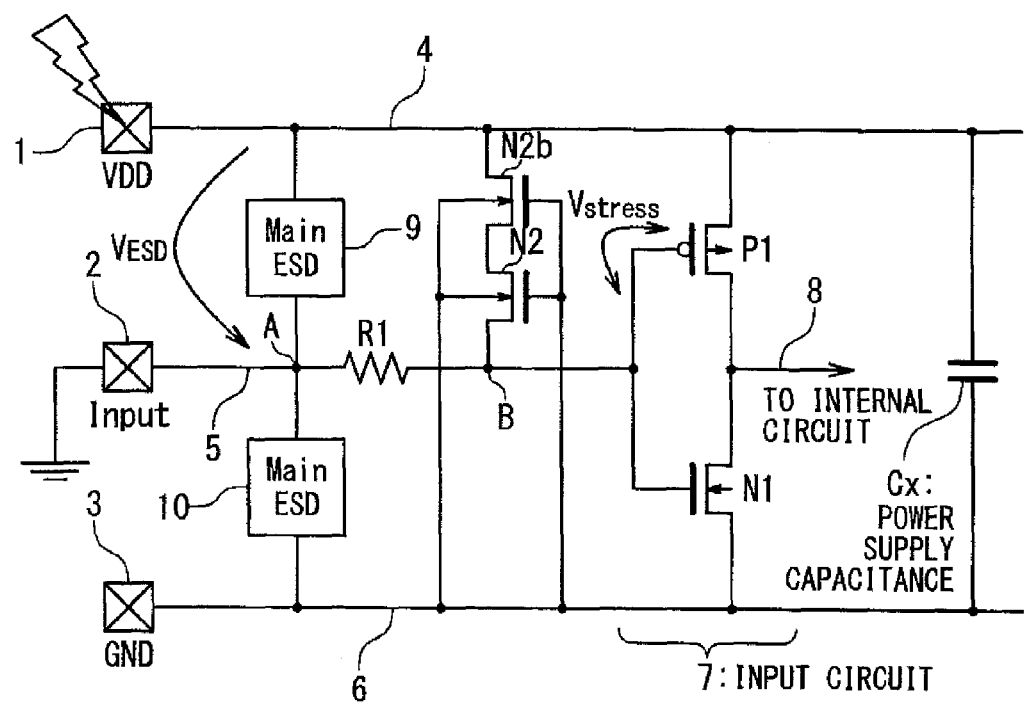
FIG. 12B is a block diagram showing further another configuration of the semiconductor device according to the fourth embodiment of the present invention.

Moreover, as shown FIGS. 12A and 12B, like the third embodiment, by inserting at least one diode D2 or at least one NMOS transistor N2b in serial with the NMOS transistor N2, a malfunction of the NMOS transistor N2 may be restricted.

Figure 13:
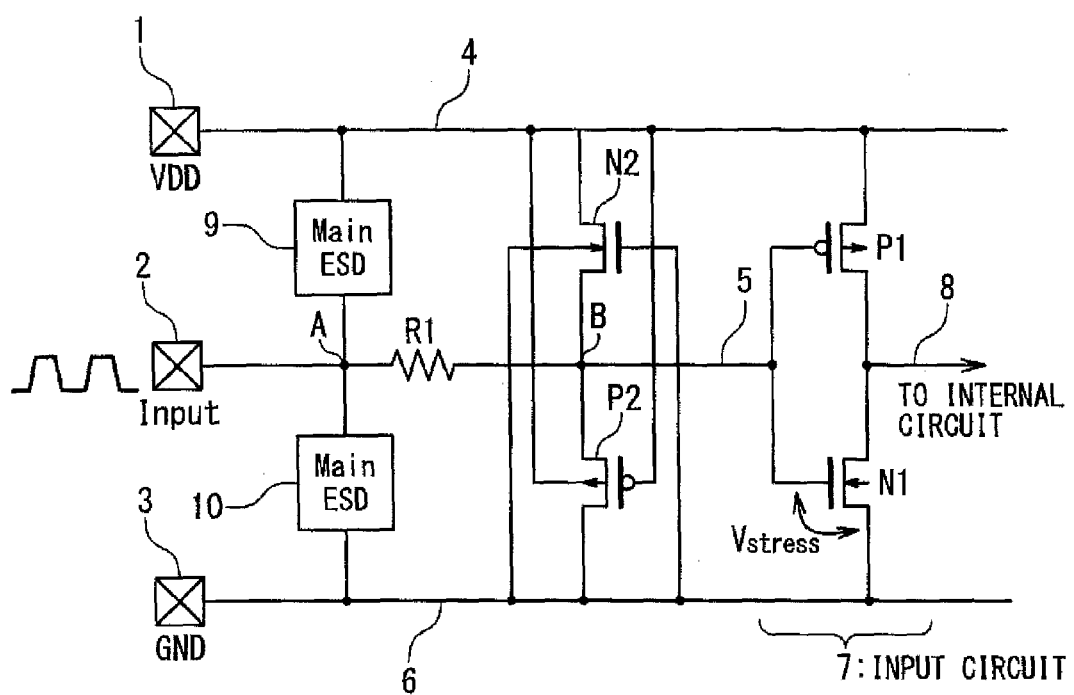
FIG. 13 is a block diagram showing a configuration of the semiconductor device according to the present invention, when the first embodiment and the fourth embodiment are applied.

Moreover, as shown in FIG. 13, both of the PMOS transistor P2 and the NMOS transistor N2 may be provided as the sub ESD protection element. Such a configuration is desirable from the viewpoint of protection of both of the PMOS transistor P1 and the NMOS transistor N1 in the input circuit 7, effectively.

As described above, various embodiments of the present invention are described, but the present invention is not limited to the above-mentioned embodiment, and a person in the art can perform various modifications. Also, the above-mentioned embodiments may be combined without any contradiction. For example, as shown in FIG. 13, the configuration provided with both of the PMOS transistor P2 and the NMOS transistor N2 and the configuration restricting the excess current by the resistance elements R2 and R3 are combined at a same time.

What is claimed is:

1. A semiconductor device comprising:
   a power supply line supplied with a power supply voltage;
   a power supply pad connected with said power supply line;
   a ground line;
   a ground pad connected with said ground line;
   a signal input pad;
   a protection object circuit;
   a first connection node connected with said protection object circuit;
   a first resistance element connected between said signal input pad and said first connection node;
   a first protection circuit section arranged between said power supply line or said ground line and a second connection node between said signal input pad and said first resistance element; and
   a second protection circuit section,
   wherein said second protection circuit section comprises:
   at least one of a first PMOS transistor having a source connected with said first connection node, a drain connected with said ground line and a gate and a back gate connected with said power supply line, and a first NMOS transistor having a source connected with said first connection node, a drain connected with said power supply line and a gate and a back gate connected with said ground line.

2. The semiconductor device according to claim 1, wherein said second protection circuit section comprises:
   said first PMOS transistor; and
   one of a second resistance element connected between said back gate of said first PMOS transistor and said power supply line, and a third resistance element connected between said first connection node and said ground line in series with said first PMOS transistor.

3. The semiconductor device according to claim 1, wherein said second protection circuit section comprises:
   said first NMOS transistor;
   one of a second resistance element connected between said back gate of said first NMOS transistor and said ground line, and a fifth resistance element connected between said first connection node and said power supply line in series with said first NMOS transistor.

4. The semiconductor device according to claim 1, wherein said second protection circuit section comprises:
   said first PMOS transistor;
   a first diode element connected between said first connection node and said ground line in series with said first PMOS transistor in a forward direction from said first connection node to said ground line.

5. The semiconductor device according to claim 4, wherein said second protection circuit section comprises:
   said first NMOS transistor; and
   a second diode element connected between said first connection node and said power supply line in series with said first NMOS transistor in a forward direction from said power supply line to said first connection node.

6. The semiconductor device according to claim 1, wherein said second protection circuit section comprises:
   said first PMOS transistor; and
   a second PMOS transistor connected between said first connection node and said ground line in series with said first PMOS transistor and having a gate and a back gate connected with said power supply line.

7. The semiconductor device according to claim 1, wherein said second protection circuit section comprises:
   said first NMOS transistor; and
   a second NMOS transistor connected between said first connection node and said power supply line in series with said first NMOS transistor and having a gate and a back gate connected with said ground line.

8. The semiconductor device according to claim 1, wherein said second protection circuit section comprises said first PMOS transistor, and
   wherein a first protection element provided in said first protection circuit section is configured to be able to pass a current which is larger than that of said first PMOS transistor.

9. The semiconductor device according to claim 1, wherein said second protection circuit section comprises said first NMOS transistor, and
   wherein a first protection element provided in said first protection circuit section is configured to be able to pass a current which is larger than that of said first NMOS transistor.

10. The semiconductor device according to claim 1, wherein said protection object circuit comprises:
    a third NMOS transistor having a drain connected with an internal circuit, a source connected with said ground line and a gate connected with said first connection node; and
    a third PMOS transistor having a drain connected with said internal circuit, a source connected with said power supply line and a gate connected with said first connection node.

* * * * *